(12) United States Patent
Seo

(10) Patent No.: US 6,955,990 B2
(45) Date of Patent: Oct. 18, 2005

(54) METHODS FOR FORMING A GATE IN A SEMICONDUCTOR DEVICE

(75) Inventor: Young Hun Seo, Bucheon-si (KR)

(73) Assignee: DongbuAnam Semiconductor (KR)

( * ) Notice: Subject to any disclaimer, the term of this patent is extended or adjusted under 35 U.S.C. 154(b) by 0 days.

(21) Appl. No.: 10/750,245

(22) Filed: Dec. 31, 2003

(65) Prior Publication Data
US 2004/0157381 A1 Aug. 12, 2004

(30) Foreign Application Priority Data
Feb. 4, 2003 (KR) .............................. 10-2003-0007001

(51) Int. Cl.[7] .................. H01L 21/302; H01L 21/461
(52) U.S. Cl. ..................................................... 438/706
(58) Field of Search ................................ 438/706, 708, 438/734, 738, 709, 725

(56) References Cited

U.S. PATENT DOCUMENTS 5,312,518 A * 5/1994 Kadomura ................... 156/646
5,880,035 A * 3/1999 Fukuda ....................... 438/734
6,063,710 A * 5/2000 Kadomura et al. ......... 438/715
6,174,408 B1 * 1/2001 Kadomura et al. ..... 156/345.27

* cited by examiner

Primary Examiner—David Nhu
(74) Attorney, Agent, or Firm—Hanley, Flight & Zimmerman, LLC.

(57) ABSTRACT

Methods for forming a gate in a semiconductor device are disclosed. In an example method, the gate is formed such that the CD of an upper portion of the gate is greater than the CD of a lower portion of the gate by performing multiple etching processes. In an illustrated example, the etching processes are performed in three stages, (i.e., a first dry etching process for etching the upper portion, a second dry etching process for etching the lower portion and a third dry etching) under three different process conditions, thereby causing a sidewall profile of the gate to have a two-layered structure.

6 Claims, 3 Drawing Sheets

METHODS FOR FORMING A GATE IN A SEMICONDUCTOR DEVICE

FIELD OF THE DISCLOSURE

The present disclosure relates generally to semiconductor devices and, more particularly, to methods for forming a gate in a semiconductor device.

BACKGROUND

In order to increase the operating speed of a semiconductor device, various approaches have been proposed for decreasing a gate critical dimension (hereinafter referred to as "CD") or optimizing ion implantation conditions. However, an improvement in the manufacturing equipment is required for optimizing the ion implantation conditions, and a great decrease of the gate CD affects a formation of silicide, thereby resulting in an interrupt of current flow.

For this reason, approaches for reducing the gate CD as well as decreasing a silicide resistance have recently been developed. Among such approaches, there has steadily been developed a process for forming a CD of an upper portion of the gate greater than that of a lower portion of the gate, thereby shortening a channel length of the gate to achieve high speed operation. However, most of the approaches proposed heretofore require a new process flow, thereby deteriorating the yield of the semiconductor device manufacturing process.

A conventional gate forming process is shown in FIGS. 1A and 1B. Referring to FIG. 1A, after cleaning a semiconductor substrate 1 (e.g., a silicon substrate), a gate insulation film 2 is formed on the semiconductor substrate 1. A gate polysilicon layer 3 for forming a gate electrode is deposited on the gate insulation film 2. A photoresist film is deposited on the gate polysilicon layer 3 and patterned, thereby forming a photoresist pattern 4 for use as an etching mask for forming a gate region.

As shown in FIG. 1B, by selectively dry etching the gate polysilicon layer 3 using the photoresist pattern 4 as a mask until the gate insulation film 2 is exposed, a gate electrode having a desired gate profile is formed. The photoresist pattern 4 is then removed. Sidewall polymers are then formed on the gate polysilicon layer 3 by sidewall polymerization resulting from etching gases supplied under certain process conditions. These sidewall polymers are then removed in a subsequent cleaning process.

An organic or inorganic antireflective coating (ARC) layer may be deposited on the gate polysilicon layer 3. In such a case, the ARC layer is first etched using the photoresist pattern 4 as a mask, (e.g., by an endpoint detection apparatus) before etching the gate polysilicon layer 3.

As shown in FIG. 1B, the gate profile formed by the conventional gate forming process shows that the CD of the lower portion of the gate is greater than or equal to that of the upper portion of the gate. As a result, the conventional gate forming process does not achieve the desired result of forming the CD of the upper portion greater than that of the lower portion.

DETAILED DESCRIPTION

Figure 1A:
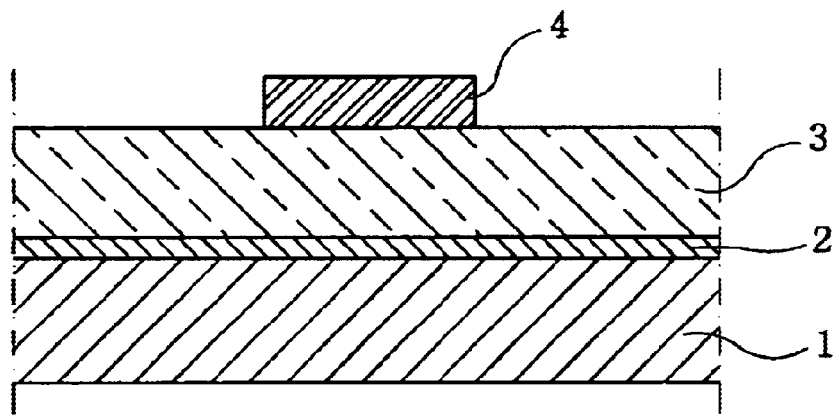
FIGS. 1A to 1B are cross sectional views illustrating a conventional process of forming a gate in a semiconductor device.
Figure 1B:
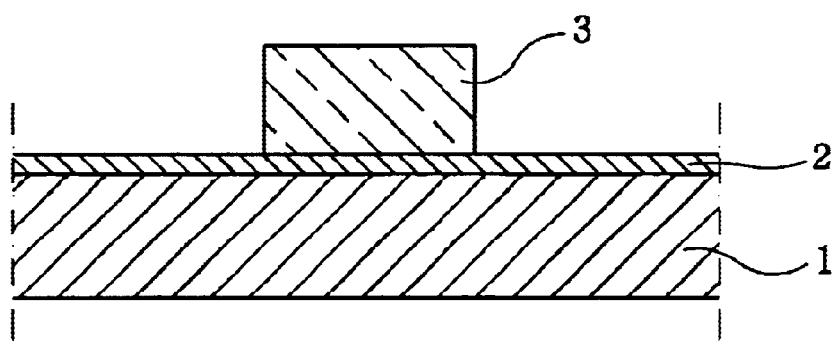
Figure 2A:
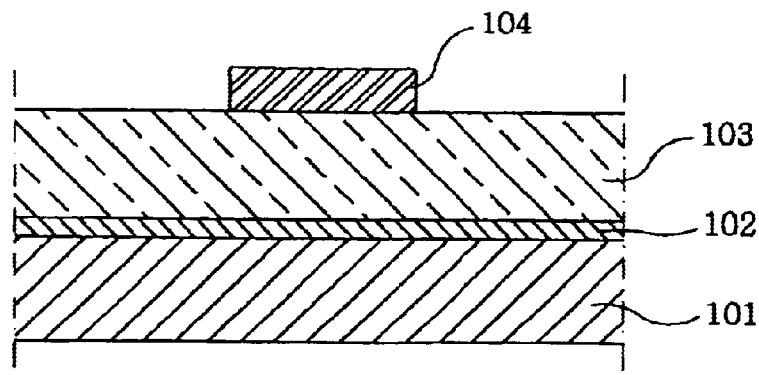
FIGS. 2A to 2E are cross sectional views illustrating an example process for forming a gate in a semiconductor device in accordance with the teachings of the present disclosure.

Referring to FIG. 2A, after cleaning a semiconductor substrate 101 (e.g., a silicon substrate), a gate insulation film 102 and a gate polysilicon layer 103 are sequentially formed on the semiconductor substrate 101. A photoresist film is deposited on the gate polysilicon layer 103 and patterned to form a photoresist pattern 104 for subsequent use as an etching mask in forming a gate region.

Figure 2B:
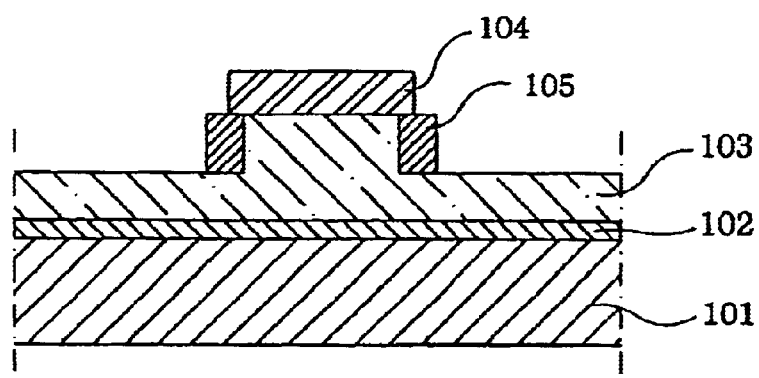

As shown in FIG. 2B, an upper portion of the gate having a first desired CD is formed by performing a first dry etching process up to a predetermined depth on the gate polysilicon layer 103 using the photoresist pattern 104 as a mask. Sidewall polymers 105 are formed on sidewalls of the remaining upper portion of the gate polysilicon layer 103 by sidewall polymerization resulting from first etching gases supplied under first process conditions. In the first dry etching process, the first process conditions are set such that the sidewall polymers 105 are formed thicker than in a subsequent second dry etching process to be described later.

Preferably, $CF_4$, HBr, $Cl_2$ and $HeO_2$ are used as the first etching gases. Preferably, the feed rates of the $CF_4$, HBr, $Cl_2$ and $HeO_2$ are about 1~100 sccm, about 5~180 sccm, about 1~100 sccm and about 1~50 sccm, respectively. Also, the source power and the bias power of the plasma preferably range from about 10 W to about 1000 W and from about 1 W to about 200 W, respectively. Moreover, the pressure of the plasma preferably ranges from about 1 mT to about 30 mT.

Figure 2C:
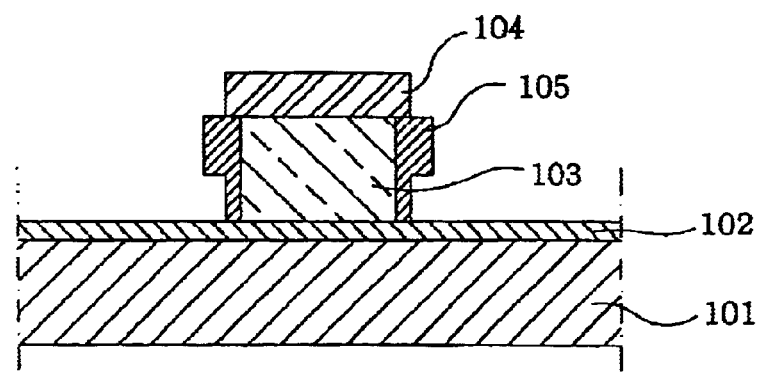

Referring to FIG. 2C, a lower portion of the gate having a second desired CD is formed by using the photoresist pattern 104 as a mask when performing a second dry etching process on the gate polysilicon layer 103 until the gate insulation film 102 is exposed. Similarly to the first dry etching process, sidewall polymers are formed on the sidewalls of the remaining lower portion of the gate polysilicon layer 103 by the sidewall polymerization resulting from the second etching gases supplied under the second process conditions. In the second dry etching process, the second process conditions are set such that the sidewall polymers 105 are formed thinner than in the first dry etching process.

Preferably, HBr, $Cl_2$ and $HeO_2$ are used as the second etching gases in the second dry etching process. Preferably, the feed rates of the HBr, $Cl_2$ and $HeO_2$ are about 1~300 sccm, about 1~200 sccm and about 1~50 sccm, respectively. Also, the source power and the bias power of the plasma preferably range from about 10 W to about 500 W and from about 5 W to about 150 W, respectively. Moreover, the pressure of the plasma preferably ranges from about 1 mT to about 50 mT.

Figure 2D:
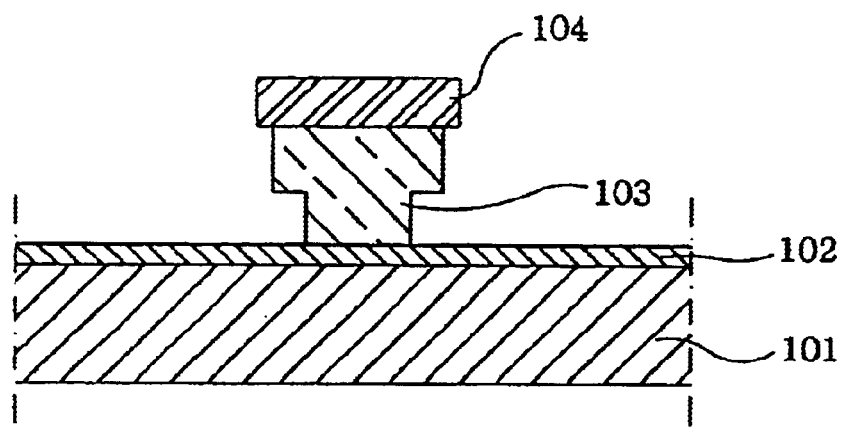

Referring to FIG. 2D, the gate polysilicon layer 103 is etched by a third dry etching process, wherein the sidewalls of the gate polysilicon layer 103 are over etched to have a desired gate profile wherein the CD of the upper portion of the gate is greater than the CD of the lower portion of the gate. Specifically, the sidewall polymers 105 generated by the sidewall polymerization are removed by the third dry etching process. Since the sidewall polymers of the upper portion of the gate are thicker than the sidewall polymers of the lower portion of the gate, the sidewall polymers of the lower portion of the gate are completely removed while the sidewall polymers of the upper portion of the gate still remain. Accordingly, the lower portion of the gate polysilicon layer 103 is over etched to have the desired CD by the third dry etching process.

Preferably, HBr, $HeO_2$ and $O_2$ are used as the etching gases in the third dry etching process. Preferably, the feed rates of the HBr, HeO$_2$ and O$_2$ are about 1~300 sccm, about 1~100 sccm and about 0.1~50 sccm, respectively. Also, the source power and the bias power of the plasma preferably range from about 10 W to about 2000 W and from about 1 w to about 300 W, respectively. Moreover, the pressure of the plasma preferably ranges from about 1 mT to about 200 mT.

Figure 2E:
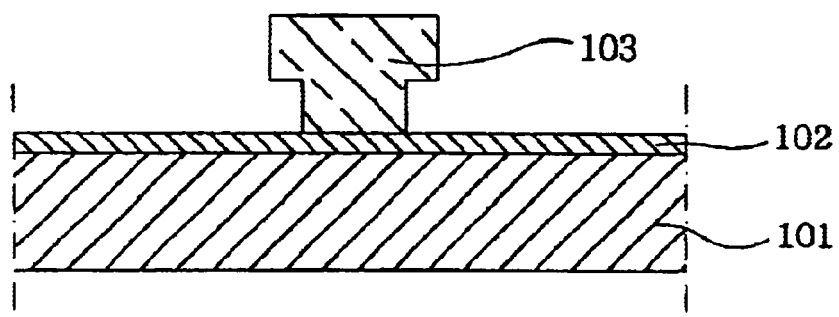

As shown in FIG. 2E, the photoresist pattern 104 is then removed, thereby completing a gate electrode having an improved profile.

In summary, the gate polysilicon layer 103 is etched to have the desired thickness by a first dry etching process. The remainder of the gate polysilicon layer 103 is then etched by a second dry etching process. Then, by controlling an over etching time period of a third dry etching process, a gate electrode having the desired profile can be obtained.

An organic or inorganic antireflective coating (ARC) layer may be deposited on the gate polysilicon layer 103. In such a case, the ARC layer (not shown) should be first etched using the photoresist pattern 104 as a mask, (e.g., by an endpoint detection apparatus) before etching the gate polysilicon layer 103.

Further, in the preferred example described above, the dry etching is performed in three stages, (i.e., the first dry etching process for etching the upper portion, the second dry etching process for etching the lower portion and the third dry etching), thereby allowing the sidewall profile of the gate to have a two-layered structure. However, it will be appreciated by persons of ordinary skill in the art that the dry etching may be performed in different numbers of stages to form the sidewall profile of the gate electrode in a multi-layered structure. For example, the CD of each layer may be gradually decreased from the top layer to the bottom layer.

In the illustrated example, the CD of the upper portion of the gate is made greater than the CD of the lower portion of the gate by separate etching processes in which the process conditions are varied. As a result, the CD of the lower portion of the gate is reduced without introducing any new process flow and, at the same time, a silicide resistance is decreased, so that reliability during high speed operation may be improved.

From the foregoing, persons of ordinary skill in the art will appreciate that example methods have been disclosed for forming a gate in a semiconductor device, wherein a CD of an upper portion of the gate is made greater than the CD of a lower portion of the gate by performing multiple etching processes in which the process conditions are changed. The disclosed methods reduce the CD of the lower portion of the gate while decreasing silicide resistance.

An example method disclosed herein comprises: forming a gate insulation film on a semiconductor substrate; forming a gate polysilicon layer for forming a gate electrode on the gate insulation film; performing a first dry etching process on an upper portion of the gate polysilicon layer, wherein sidewall polymers are formed on a remaining upper portion of the gate polysilicon layer by sidewall polymerization resulting from first etching gases supplied under first process conditions; performing a second dry etching process on a lower portion of the gate polysilicon layer, wherein sidewall polymers are formed on sidewalls of a remaining lower portion of the gate polysilicon layer by sidewall polymerization resulting from second etching gases supplied under second process conditions, the sidewall polymers formed in the second dry etching process being thinner than those in the first dry etching process; and performing a third dry etching process on the gate polysilicon layer to remove the sidewall polymers, wherein the lower portion of the gate polysilicon layer is over etched so that an upper portion of the gate has a CD greater than that of the lower portion of the gate.

From the foregoing, persons of ordinary skill in the art will appreciate that, while maintaining an existing gate forming process flow, the gate profile may be improved by changing the process conditions such as the gas, the pressure and the power.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method to form a gate in a semiconductor device comprising:

forming a gate insulation film on a semiconductor substrate;

forming a gate polysilicon layer on the gate insulation film;

performing a first dry etching process on the gate polysilicon layer under first process conditions, wherein upper sidewall polymers are formed on an upper portion of the gate polysilicon layer;

performing a second dry etching process on the gate polysilicon layer under second process conditions, wherein lower sidewall polymers are formed on sidewalls of a lower portion of the gate polysilicon layer by sidewall polymerization, the lower sidewall polymers being thinner than the upper sidewall polymers; and performing a third dry etching process on the gate polysilicon layer to remove the upper and lower sidewall polymers, wherein the lower portion of the gate polysilicon layer is over etched so that a CD of the upper portion of the gate is greater than a CD of the lower portion of the gate.

2. A method as defined in claim 1, wherein at least one of the first dry etching process and the second dry etching process is performed in multi-stages so that the gate has a sidewall profile has a multi-layered structure wherein a CD of each layer is decreased relative to an immediately preceding layer.

3. A method as defined in claim 1, wherein the CD of the lower portion of the gate is set by controlling an over etching time period of the third dry etching process.

4. A method as defined in claim 1, wherein the first process conditions are set such that CF$_4$, HBr, Cl$_2$ and HeO$_2$ are used as the first etching gases; feed rates of the CF$_4$, HBr, Cl$_2$ and HeO$_2$ are about 1~100 sccm, about 5~180 sccm, about 1~100 sccm and about 1~50 sccm, respectively; a source power and a bias power of a plasma range from about 10 W to about 1000 W and from about 1 W to about 200 W, respectively; and a pressure of the plasma ranges from about 1 mT to about 30 mT.

5. A method as defined in claim 1, wherein the second process conditions are set such that HBr, Cl$_2$ and HeO$_2$ are used as the second etching gases; feed rates of the HBr, Cl$_2$ and HeO$_2$ are about 1~300 sccm, about 1~200 sccm and about 1~50 sccm, respectively; a source power and a bias power of a plasma range from about 10 W to about 500 W and from about 5 W to about 150 W, respectively; and a pressure of the plasma ranges from about 1 mT to about 50 mT.

6. A method as defined in claim 1, wherein the third dry etching is performed under third process conditions in which HBr, $HeO_2$ and $O_2$ are used as etching gases; feed rates of the HBr, $HeO_2$ and $O_2$ are about 1~300 sccm, about 1~100 sccm and about 0.1~50 sccm, respectively; a source power and a bias power of a plasma range from about 10 W to about 2000 W and from about 1 W to about 300 W, respectively; and a pressure of the plasma ranges from about 1 mT to about 200 mT.

* * * * *